(12) United States Patent
Halling

(10) Patent No.: US 10,395,889 B2
(45) Date of Patent: Aug. 27, 2019

(54) IN SITU BEAM CURRENT MONITORING AND CONTROL IN SCANNED ION IMPLANTATION SYSTEMS

(71) Applicant: Axcelis Technologies, Inc., Beverly, MA (US)

(72) Inventor: Alfred Mike Halling, Wenham, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 15/258,723

(22) Filed: Sep. 7, 2016

(65) Prior Publication Data
US 2018/0068828 A1     Mar. 8, 2018

(51) Int. Cl.
*H01J 37/317*     (2006.01)
*H01J 37/304*     (2006.01)
*H01J 37/147*     (2006.01)

(52) U.S. Cl.
CPC .......... *H01J 37/304* (2013.01); *H01J 37/147* (2013.01); *H01J 37/3171* (2013.01);
(Continued)

(58) Field of Classification Search
CPC ................ H01J 37/3171; H01J 37/304; H01J 2237/31703; H01J 2237/24535;
(Continued)

(56) References Cited

U.S. PATENT DOCUMENTS

| 6,646,276 B1 * | 11/2003 | Mitchell | ............... H01J 37/304 250/398 |
| 7,550,751 B2 | 6/2009 | Benveniste et al. | |

(Continued)

FOREIGN PATENT DOCUMENTS

EP     0975004 A2     1/2000

OTHER PUBLICATIONS

International Search Report and Written Opinion dated Jan. 1, 2018 for International Application No. PCT/US2017/050261.

*Primary Examiner* — Wyatt A Stoffa
(74) *Attorney, Agent, or Firm* — Eschweiler & Potashnik, LLC

(57) ABSTRACT

A system and method for controlling an ion implantation system as a function of sampling ion beam current and uniformity thereof. The ion implantation system includes a plurality of ion beam optical elements configured to selectively steer and/or shape the ion beam as it is transported toward a workpiece, wherein the ion beam is sampled at a high frequency to provide a plurality of ion beam current samples, which are then analyzed to detect fluctuations and/or nonuniformities or unpredicted variations amongst the plurality of ion beam current samples. Beam current samples are compared against predetermined threshold levels, and/or predicted nonuniformity levels to generate a control signal when a detected nonuniformity in the plurality of ion beam current density samples exceeds a predetermined threshold. A control system can be configured to generate a control signal for interlocking the ion beam transport in the ion implantation system or for varying an input to at least one beam optical element to control variations in beam current.

23 Claims, 9 Drawing Sheets

(52) U.S. Cl.
CPC .............. *H01J 2237/244* (2013.01); *H01J 2237/24535* (2013.01); *H01J 2237/30455* (2013.01); *H01J 2237/30477* (2013.01); *H01J 2237/31703* (2013.01)

(58) Field of Classification Search
CPC ....... H01J 2237/30477; H01J 2237/245; H01J 2237/3045; H01J 2237/30455; H01J 2237/24542; H01J 2237/2237
See application file for complete search history.

(56) References Cited

U.S. PATENT DOCUMENTS

| | | | |
|---|---|---|---|
| 7,856,110 B2 | 12/2010 | Fujita et al. | |
| 8,421,039 B2* | 4/2013 | Eisner | H01J 37/302 250/492.21 |
| 8,653,486 B2 | 2/2014 | Eisner | |
| 8,735,855 B2* | 5/2014 | Ninomiya | H01J 37/304 250/492.21 |
| 8,853,653 B1 | 10/2014 | Todorov et al. | |
| 8,933,424 B1 | 1/2015 | Satoh | |
| 9,006,692 B2 | 4/2015 | Todorov et al. | |
| 9,340,870 B2 | 5/2016 | Bai et al. | |
| 2002/0134948 A1* | 9/2002 | Olson | G21K 1/08 250/492.21 |
| 2005/0205807 A1* | 9/2005 | Perel | G01N 21/47 250/492.21 |
| 2008/0128621 A1* | 6/2008 | Berry | G01N 23/2255 250/338.1 |
| 2009/0242808 A1 | 10/2009 | Evans | |
| 2010/0001204 A1 | 1/2010 | White | |
| 2010/0155623 A1* | 6/2010 | Eisner | H01J 37/3171 250/492.21 |
| 2010/0308215 A1* | 12/2010 | Vanderberg | H01J 37/147 250/281 |
| 2011/0297842 A1* | 12/2011 | Ninomiya | H01J 37/304 250/396 ML |
| 2012/0248324 A1* | 10/2012 | Eisner | H01J 37/302 250/396 ML |
| 2013/0026356 A1* | 1/2013 | Vanderberg | H01J 37/147 250/281 |
| 2013/0099131 A1* | 4/2013 | Eisner | H01J 37/302 250/396 R |
| 2013/0146760 A1* | 6/2013 | Eisner | H01J 37/244 250/288 |
| 2013/0256566 A1* | 10/2013 | Kariya | H01L 21/67213 250/492.21 |
| 2014/0161987 A1* | 6/2014 | Wan | H01J 37/09 427/523 |
| 2014/0326179 A1* | 11/2014 | Todorov | C23C 14/48 118/697 |
| 2016/0189928 A1* | 6/2016 | Vanderberg | H01J 37/3007 250/492.21 |
| 2017/0271128 A1* | 9/2017 | Ninomiya | H01J 37/3171 |
| 2018/0068829 A1* | 3/2018 | Ishibashi | H01J 37/3002 |

* cited by examiner

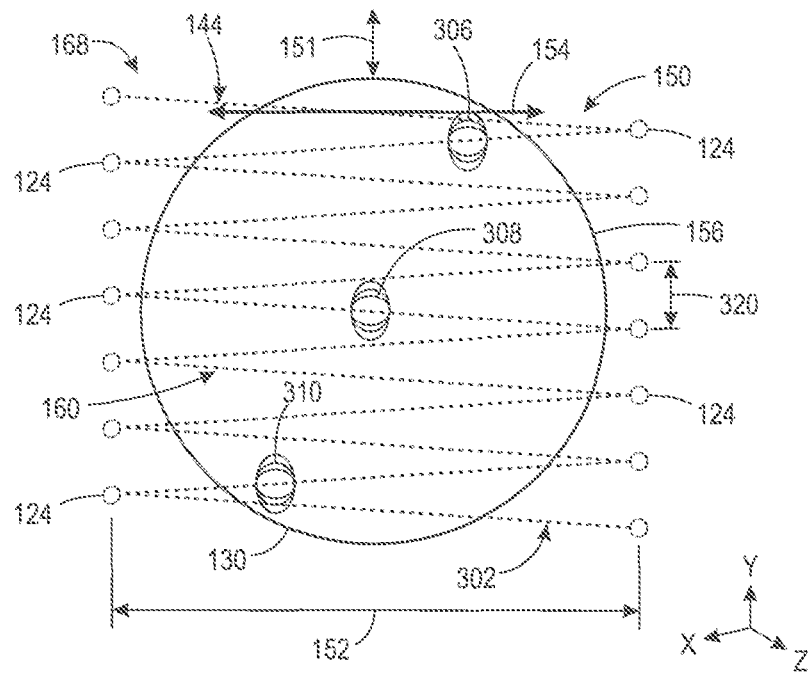
FIG. 3
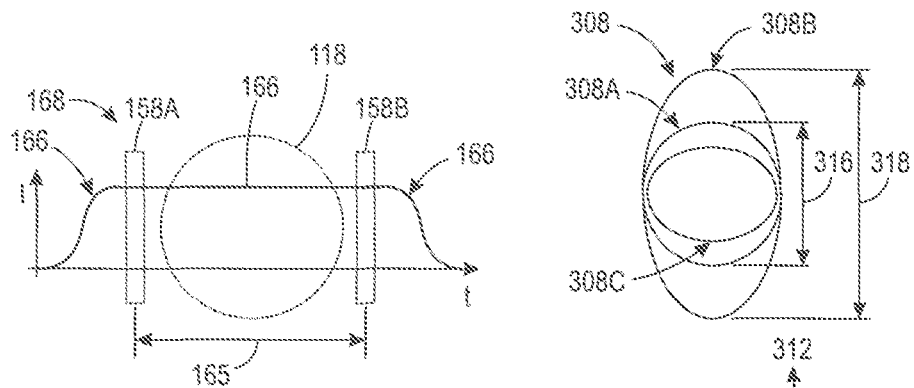
FIG. 4
FIG. 5

IN SITU BEAM CURRENT MONITORING AND CONTROL IN SCANNED ION IMPLANTATION SYSTEMS

FIELD OF THE INVENTION

The present invention relates generally to ion implantation systems, and more specifically to systems and methods for real time, in situ ion beam current sampling and monitoring for providing control of the ion implantation system.

BACKGROUND OF THE INVENTION

In the manufacture of semiconductor devices, ion implantation is used to dope a workpiece, typically provided in the form of a substrate such as a Silicon or Gallium Arsenide wafer. The wafer is bombarded with impurities or dopants for implanting these dopants within the crystalline structure of the wafer to modify the electrical characteristics or otherwise transform the substrate. As such, ion implantation systems are well-known in the semiconductor manufacturing field, as capital equipment utilized to dope workpieces with ions by implanting ions from an ion beam into the workpiece, or to form passivation layers during fabrication of an integrated circuit. When used for doping semiconductor wafers, the ion implantation system injects a selected ion species into the workpiece to produce the desired extrinsic material.

Typical ion implantation systems include an ion source for generating electrically charged ions from ionizable source materials. The generated ions are formed into a beam and accelerated with the help of a strong electric field so as to be directed along a predetermined beam path to an implantation end station. For example, implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

The ion implantation system may include beam forming, steering, deflecting, shaping, filtering and charging subsystems (e.g. beam optical elements or beam optics) positioned between the ion source and the end station. The beam optical elements manipulate and maintain the ion beam along an elongated interior cavity or passageway (e.g beamline) through which the ion beam passes on route to the end station where the workpiece is positioned.

In most ion implantation applications, the goal of the implantation process is to deliver a precisely-controlled amount of dopant uniformly over the entire area of the surface of the workpiece or wafer. The most widely accepted approach for this process is embodied in a so-called serial implantation architecture, where individual workpieces are sequentially provided to an end station for implantation by the ion beam. In order to achieve uniform doping utilizing an on beam having a size that is smaller than the workpiece area, the ion beam and the wafer are moved relative to one another in order to cause the beam to impinge on the entire surface area of the wafer. One commonly known system architecture for accomplishing this task is known as "two dimensional (2-D) mechanical scanning," as disclosed, for example, in U.S. Pat. No. 6,956,223, where the wafer is scanned in two substantially orthogonal dimensions with respect to a stationary "spot" ion beam. Using 2-D mechanical scanning, the wafer is quickly scanned in front of a fixed ion beam in a so-called "fast scan" direction, while being simultaneously slowly scanned in an orthogonal "slow scan" direction, thereby "painting" the wafer with ions by transporting the wafer in front of the ion beam in a generally moving zigzag pattern. Alternatively, another well-known serial system architecture used in ion implantation systems is a so-called "hybrid scan system," where the ion beam is swept or scanned back and forth along an axis in one direction in a raster-like manner to form a ribbon-shaped beam, and the workpiece is mechanically moved along a direction orthogonal to the axis of the scanned ion beam.

A continuing trend in the field of semiconductor manufacturing involves various semiconductor workpiece sizes, such as 300 mm diameter wafers, coupled with higher device densities. Larger workpiece size increases the cost of individual workpieces, and higher device densities increase the cost of processing, and the associated value of each workpiece. As a result, control over implantation uniformity with respect to ion beams and other parameters is more critical than ever in avoiding or mitigating the cost associated with scrapping workpieces.

In order to maintain uniformity of the implantation process, the total ion beam current is often measured during implantation, wherein a sampling cup, typically a Faraday cup or cups, is/are placed along the path of the ion beam, typically in front of, adjacent to, or behind the wafer. As in the case of a scanned beam architecture, the beam scan width is generally dictated by the position of the Faraday cup(s) such that the ion beam is fully, or at least partially, scanned over so-called side cup(s) adjacent to the wafer adequate to produce reliable beam current measurements. A tuning cup or cups may also be positioned upstream or downstream of the typical location of the workpiece for tuning of the ion beam when the workpiece is not present or is in a position such that at least a portion of the ion beam does not impinge on the wafer. In addition, a traveling, or so-called "profiling" Faraday cup can be used to monitor the ion beam as the Faraday cup is set in motion in front of the workpiece position from one end of the scanned ion beam to the other. The profiling Faraday can be provided in the form of a multi-cup structure or a single multi-Faraday per cup structure. Conventionally, all (or some) of such sampling cups are utilized to monitor the total current of the ion beam entering the end station in order to adjust implant feed rates and exposure times of the workpiece to the ion beam. For example, in U.S. Pat. No. 4,922,106, a Faraday detector is slowly translated to produce an integrated beam current or dose measurement as a function of the position of the Faraday detector, thereby providing a signal representative of the ion beam intensity. This signal may be used to adjust an oscillatory scan voltage so that the integrated beam intensity is uniform. In that patent, a time integral of the sensed beam current is used as a feedback signal that is applied to a dose controller for controlling the operation of the beam scanning element.

One problem, which is presently appreciated, is that beam current density or angle, often changes unpredictably during an implant cycle, sometimes during a single ion beam scan pass, and sometimes multiple times during the course of a single scan pass. These changes can be manifestations of long-term wear of beamline components over time, or drift in voltage power supplies over the course of multiple ion implant cycles, or during a single ion implant cycle. These variations can also be manifestations of short-term fluctuations or "spikes" in current distribution caused by disparities in beam shape and/or angle, shifting of beam distribution within the ion beam, system noise, or particle contamination within the ion beam, among other factors. Other factors can include changes in the beamline pressure, emission from elements exposed to the beam, and beam interaction with the wafer as it is moved through the beam. While some variations in beam current can be expected and tolerated as a so-called predicted nonuniformity (PNU) in the ion beam, many types of changes in beam current can significantly impact ion implant uniformity and cannot be tolerated and are unacceptable.

The present invention addresses these issues by monitoring the ion beam current via high frequency sampling to generate a waveform representative of real time, in situ beam current as the ion beam is scanned. The generated waveform can be stored and/or displayed in real time to provide a visual representation of the ion beam current information in graphic form for beam uniformity. The beam current sampling can also be analyzed and used to generate control signals for controlling the ion implantation system. One exemplary control signal can abort a given implant cycle in cases where the beam current drift, variation and/or fluctuation exceeds a predetermined threshold level relative to previous current samples or when the beam current falls outside of a predicted nonuniformity (PNU) for the beam current. In addition, collected sample data can be used to provide feedback signals for varying at least one of the upstream beam optical elements or power supplies associated therewith to provide a more uniform beam current density delivered to the workpiece.

SUMMARY OF THE INVENTION

Embodiments of the present invention include methods for monitoring and controlling ion beam uniformity in an ion implantation system, the method comprising: generating an ion beam; transporting the ion beam toward a workpiece; scanning the on beam along a scan path to create a scanned spot beam as a function of a scan waveform having a time-varying potential, wherein a value of the time-varying potential corresponds to a location of the ion beam on the scan path; providing at least one beam optical element configured to selectively steer and/or shape the ion beam as it is transported toward the workpiece, wherein the at least one beam optical element varies an effective cross-sectional shape of the ion beam; sampling the ion beam in synchronism with the scan waveform to provide a plurality of ion beam current density samples as a function of position on the workpiece and a scan direction; analyzing the plurality of ion beam current density samples to detect nonuniformity thereof; and comparing any detected nonuniformity in the plurality of ion beam current density samples against a predetermined threshold nonuniformity. The beam current sampling can also be analyzed and used to abort a given implant cycle in cases where the beam current drift, variation and/or fluctuation exceeds a predetermined threshold level relative to previous current samples or when the beam current falls outside of a so-called predicted nonuniformity (PNU) for the beam current.

In one embodiment of the present invention, a method is provided for controlling ion beam uniformity in an ion implantation system. The method includes: generating an ion beam; transporting the ion beam toward a workpiece; scanning the ion beam along a first axis to generate a scanned ion beam; and providing at least one beam optical element configured to selectively steer and/or shape the ion beam as it is transported toward the workpiece. The method further includes sampling the ion beam to provide a plurality of ion beam current samples and correlating the ion beam current samples with a scan current to provide position and direction information corresponding the scanned ion beam. The plurality of ion beam current samples is analyzed to detect nonuniformity therein, and to generating a control signal.

In another embodiment of the present invention, an ion implantation system and corresponding control system is disclosed, wherein the ion implantation system includes: an ion source for generating an ion beam; a beamline configured to transport the ion beam along a beam path toward an end station configured to hold a workpiece; a plurality of beam optical elements situated along the beamline, configured to selectively steer, deflect and/or shape the ion beam as it is transported toward the workpiece; and a beam sampling system configured to sample the ion beam to provide a plurality of ion beam current samples. The control system includes a controller configured to analyze the beam current density samples to detect nonuniformity thereof and to generate a control signal in response to a detected nonuniformity.

Another embodiment of the present invention includes a method for uniformly implanting ions into a workpiece, the method comprising: generating an ion beam; transporting the ion beam along a beam path; providing at least one beam optical element or power supply associated therewith configured to act on the ion beam as it is transported along the beam path; scanning the ion beam to produce a scanned ion beam; sampling the scanned ion beam to detect fluctuations in beam current density by obtaining a plurality of different ion beam current density samples as the ion beam is scanned across the surface of the workpiece; and correlating the plurality of different ion beam current density samples to a position of the ion beam with respect to the workpiece. The method further includes steps for analyzing the ion beam current density samples and correlated position of the ion beam to determine the ion beam current density and/or angles at a respective correlated position; comparing a present ion beam current density sample to a preceding ion beam current density sample; and creating a control signal in response to the comparing step.

In yet another embodiment of the present invention, an ion implantation system is disclosed, wherein the ion implantation system comprises: a beamline configured to direct an ion beam along a beam path toward an end station configured to hold a workpiece; a scanning system configured to scan the ion beam across a surface of the workpiece in a fast scan direction; and at least one beam optical element configured to bend, deflect, focus, or otherwise modify the ion beam as the ion beam is directed toward the end station scanned. The ion implantation system further includes a beam sampling system configured to sample a beam current density of the ion beam as it is scanned in the fast scan direction, wherein the beam sampling system comprises a plurality of side Faraday cups positioned about a periphery of the workpiece and a tuning Faraday cup positioned downstream of the workpiece along the beam path, wherein the beam sampling system is configured to analyze output signals generated by the plurality of side Faraday cups and/or the tuning Faraday cup while correlate the output signals with the scanning system to provide a beam current density value relative to position of the ion beam with respect to the workpiece. A controller is coupled to the beam sampling system, configured to calculate a predicted dose uniformity of the ion beam and/or overall dose, wherein the controller is further configured to provide a control signal if a sampled ion beam value is inconsistent with the predicted dose uniformity.

Accordingly, the present disclosure provides continuous, real time, in situ, measurements of beam current densities in an ion implantation system across numerous workpieces in order to provide a wealth of data that is utilized to identify changes in characteristics of the ion beam and to further provide control of the ion implantation system. Thus, to the accomplishment of the foregoing and related ends, the invention comprises the features hereinafter fully described and particularly recited in the claims. The following description and the appended figures set forth in detail certain illustrative embodiments of the invention. These embodiments are indicative, however, of only some of the various ways in which the principles of the invention may be employed. Other objects, advantages and novel features of the invention will become apparent from the following detailed description of the invention when considered in conjunction with the figures.

BRIEF DESCRIPTION OF THE FIGURES

FIG. 3 is a plan view of an ion beam striking the surface of a workpiece in accordance with one example of the disclosure;

FIG. 4 illustrates a measured beam current waveform in relationship to side Faraday cups and a tuning Faraday in accordance with another aspect of the disclosure;

FIG. 5 is a diagram illustrating an ion beam having varying cross-sectional shapes, which can influence the uniformity of beam current delivered to the workpiece;

DETAILED DESCRIPTION OF THE INVENTION

Figure 1:
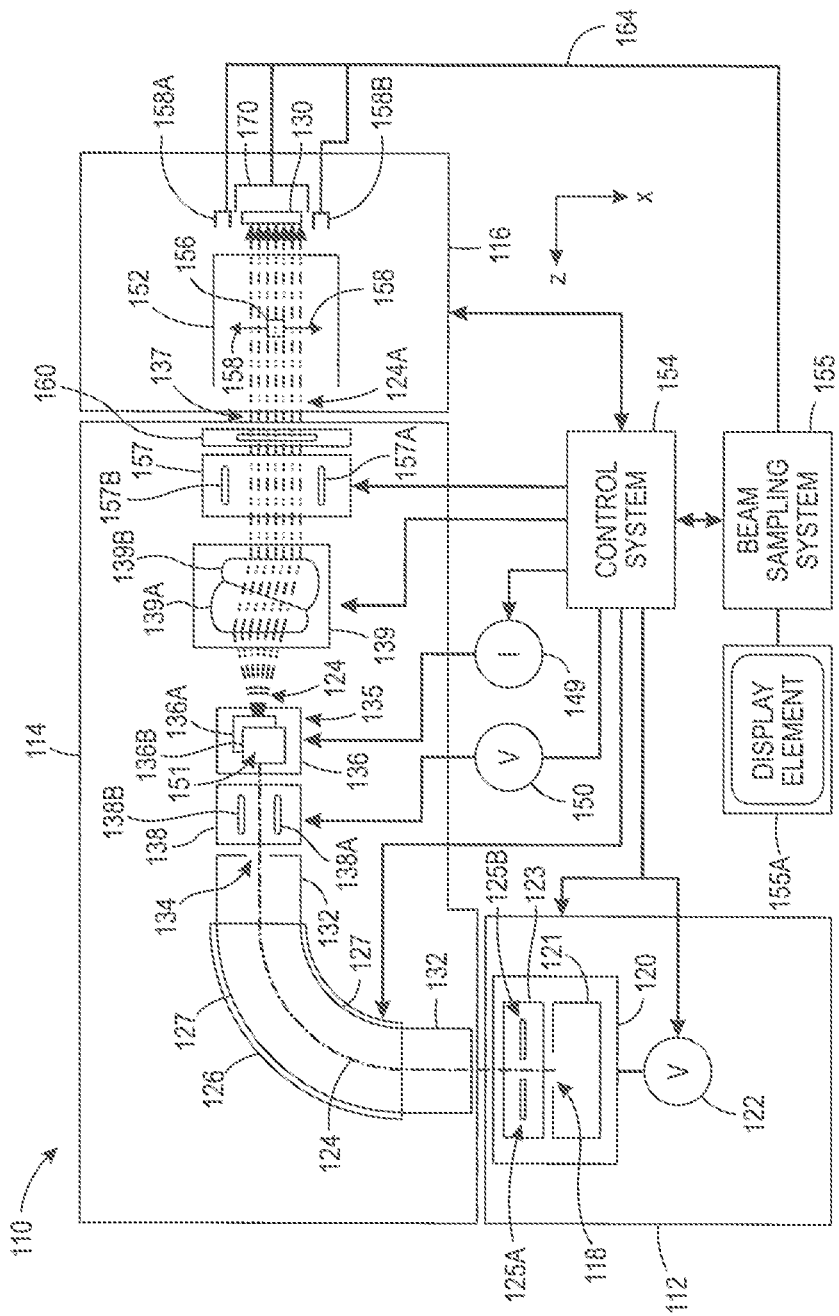
FIG. 1 is a block diagram of an exemplary ion implantation system in accordance with various aspects of the present disclosure.

The present invention is directed generally toward a system, apparatus, and method for uniformly implanting ions into a workpiece in an ion implantation system, or providing control to such an ion implantation system based on monitoring of uniformity of the ion beam. Accordingly, the present invention will now be described with reference to an exemplary ion implantation system as depicted in the accompanying figures, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without some of these specific details.

FIG. 1 illustrates an exemplary ion implantation system 110 wherein an ion beam and/or system can be controlled as described herein. The system 110 is presented for illustrative purposes and it is appreciated that aspects of the invention are not limited to the described ion implantation system and that other suitable ion implantation systems can also be employed. While the exemplary system shown in FIG. 1, represents a so-called "hybrid" or "scanned spot beam" ion implantation system architecture, it will be understood that the present invention will be equally applicable to a well-known "two dimensional mechanical scan" ion implantation system architecture as disclosed, for example in U.S. Pat. No. 7,701,230, which is hereby incorporated by reference herein. Indeed, the present invention could be adapted to single dimension mechanical scan, ribbon beam systems as well.

As a broad overview, the system 110 is comprised of a terminal 112, a beamline assembly 114, and an end station 116. The terminal 112 includes an ion source 120 powered by a high voltage power supply 122 that produces and delivers an ion beam 124 to the beamline assembly 114. The ion source 120 generates charged ions that are extracted and formed into the ion beam 124, which is directed along a beam path in the beamline assembly 114 to the end station 116. The terminal 112 can at times be described as comprising some of the beamline, where that portion of the beamline is at terminal potential.

To generate the ions, dopant material (not shown) to be ionized is provided within a generation chamber 121 of the ion source 120. The dopant gas can, for example, be fed into the chamber 121 from a gas source (not shown). In addition to power supply 122, it will be appreciated that any number of suitable mechanisms (none of which are shown) can be used to excite free electrons within the ion generation chamber 121, such as: RF or microwave excitation sources; electron beam injection sources; electromagnetic sources; and/or a cathode which creates an arc discharge within the chamber, for example. The excited electrons collide with the dopant gas molecules and ions are generated thereby. Generally, positive ions are generated although the disclosure herein is equally applicable to systems wherein negative ions are generated as well.

The ions generated in the chamber 121 are controllably extracted therefrom through an aperture or so-called "arc slit" 118 by means of an ion extraction assembly 123. The ion extraction assembly 123 commonly comprises a plurality of extraction and/or suppression electrodes, made up of generally symmetric electrode pairs 125a and 125b situated on opposite sides of the arc slit 118, for extracting the ions in the form of a dense ray of ions or an ion beam 124. The extraction assembly 123 can include, for example, a separate extraction power supply (not shown) for biasing the extraction and/or suppression electrodes 125a and 125b to induce extraction of ions from the generation chamber 121 in the form of the ion beam 124 and to accelerate the ion beam 124 downstream in the direction of the beamline assembly 114.

It should be appreciated that since the ion beam 124 comprises like charged particles, the beam may have a tendency to expand or "blow-up" radially outwardly as the like charged particles within the beam tend to repel one another. It should also be appreciated that beam blow up can be exacerbated in low energy, high current (high perveance) beams where many like charged particles are moving in the same direction, and relatively slowly, such that there is an abundance of repulsive forces among the like charged particles, but little particle momentum to keep the particles moving in the direction of the beam path. Accordingly, the extraction assembly 123 is generally configured such that the beam is extracted at a high energy so that the beam does not blow up (i.e. so that the particles have sufficient momentum to overcome repulsive forces that can lead to beam blow up). While low energy drift applications are known and could make use of the present invention, it is generally advantageous to transport the ion beam 124 at a relatively high energy throughout the system, wherein the energy of the ion beam is reduced immediately prior to impacting the workpiece 130 so as to promote beam containment during beam transport. It can also be advantageous to generate and transport molecular or cluster ions which can be transported at a relatively high energy but are implanted with a lower equivalent energy, since the energy of the molecule or cluster is divided amongst the dopant atoms of the molecule.

Moving downstream from the terminal 112, the beamline assembly 114 generally includes a mass analyzer unit 126 and a beamguide 132 defining a resolving aperture 134 at an exit of the beamguide 132. The beamline assembly typically further includes various beam focusing and/or steering components 138, a scanning system 135, a parallelizer 139, and an angular energy filter 157, (individually, beam optical elements or collectively, beam optics). The beam optics can also include a charge neutralization subsystem 160 for providing an electric charge such as electrons to the beamline and/or workpiece to be implanted to counteract beam blow up and other charging problems by matching the ion beam current with an electron current equal to that of the workpiece, generating an ion beam having an overall charge neutrality. Collectively, these various beamline components are referred to herein as beam optics or beam optical elements.

In the illustrated embodiment, the mass analyzer 126 comprises one or more magnets that serve to establish a dipole magnetic field. As the beam 124 enters the mass analyzer 126, it is correspondingly bent by the magnetic field such that ions of an inappropriate charge-to-mass ratio are rejected from the ion beam. More particularly, ions having too great or too small a charge-to-mass ratio are deflected into side walls 127 of the mass analyzer 126, while ions in the beam 124 having the desired charge-to-mass ratio are allowed to pass therethrough and exit through a resolving aperture 134.

The scanning system 135 in the illustrated example can include an electrostatic or a magnetic scanning element 136 and optional focusing and/or steering element 138. Respective power supplies 149, 150 are operatively coupled to the scanning element 136 and the focusing and steering element 138, and more particularly to respective electrodes 136a, 136b and 138a, 138b located therein. The focusing and steering element 138 receives the mass analyzed ion beam 124 having a relatively narrow profile (e.g., a so-called "spot" or "pencil" beam), and a voltage applied by the power supply 150 to the plates 138a and 138b operates to focus and steer the beam, preferably to a desired scan point such as a scan vertex 151 of the scanning element 136. A continuously variable current waveform provided by the power supply 149 to the scanner plates 136a and 136b causes the ion beam 124 to be deflected and scanned back and forth, producing an elongated, "ribbon-shaped," ion beam (e.g., a scanned spot beam), having a width that is preferably at least as wide as, or wider than, the workpiece 130 being implanted by the ion beam.

It will be appreciated that the focusing and/or steering element 138 can be made up of one or a plurality of elements and/or subsystems, and are commonly provided in the form of a quadrupole magnet commonly used in particle ion focusing. Various alternative elements such as, for example, an Einzel lens or other unipontential or multipotential lens structure can be incorporated to provide ion beam optics for focusing or deflecting ions in flight, which is accomplished through manipulation of the electric or magnetic fields in the path of the ions by varying the voltages applied to the electrodes of the various beam optical elements.

Once the beam is passed through the scanning system 136, the scanned beam 124 is then passed through a parallelizer 139, which, in the illustrated embodiment, comprises two dipole magnets 139a, 139b. In the illustrated example, the dipoles have equal angles and opposite bend directions such that the dipoles are substantially trapezoidal and are oriented to mirror one another to cause the beam 124 to bend along a substantially "s" shaped path. The primary purpose of the dipoles is to cause the divergent beamlets originating from the scanner 136 to become parallel, thereby forming a ribbon shaped beam having substantially parallel beamlets. The use of two symmetric dipoles results in symmetrical properties across the ribbon beam in terms of beamlet path length and first and higher order focusing properties. The parallelizer 139 causes the scanned beam 124 to alter its path such that the beam 124 travels parallel to a beam axis regardless of the scan angle at which a particular beamlet exits the scanner so that the implantation angle at which the beamlet strikes the workpiece 130 is relatively uniform across the surface thereof.

Although deceleration of the beam is not required, one or more deceleration stages 157 are located downstream of the parallelization component 139 in this example. As previously noted, to this point in the system 110, the beam 124 is generally transported at a relatively high energy level for mitigating against the propensity for beam blow up, which can be particularly high where beam density is elevated such as at the resolving aperture 134, for example. The deceleration stage 157 comprises one or more electrodes 157a, 157b operable to decelerate the beam 124. The electrodes 157 are typically apertures through which the beam travels and may be drawn as straight lines in FIG. 1. It will be appreciated that although a pair of electrodes are shown and described as the components making up the deceleration stage 157, as well as any of the components making up the beam optics of the system 110 may comprise any suitable number of electrodes arranged and biased to accelerate and/or decelerate ions, as well as to focus, bend, deflect, converge, diverge, scan, parallelize and/or decontaminate the ion beam 124. Additionally, any of the components making up the beam optics the may comprise electrostatic deflection plates (e.g., one or more pairs thereof), as well as an Einzel lens, quadrupoles and/or other elements that can manipulate or effect the trajectory of the ion beam.

The ion beamline can also include a charge neutralization subsystem such as a plasma electron flood device 160, which produces neutralizing electrons in a region through which the ion beam passes for counteracting charge build-up within the ion beam. Thus, charges within the ion beam can be compensated for by providing electric charge having a polarity opposite to the ion beam and the workpiece to be implanted. For example, in the case of a positively charged ion beam, it is common practice to provide electrons in an amount equal to the amount of ions per unit time provided to the workpiece, thereby matching the ion beam current with an equal electron current at the workpiece. This is typically brought about by a device that produces electrons via electron generating processes such as thermionic emission, secondary emission, discharge, or RF filed, wherein the electrons are directed to the ion beam or directly to the workpiece. These devices are typically designated electron guns, secondary electron flood, plasma electron flood, etc. Furthermore, microwave and RF discharges (e.g., RF plasma electron flood) can be scaled to large volumes but are more complicated and expensive to try to sustain, requiring matching circuits and costly high-frequency power generation.

Moving further downstream to the end station 116, the end station provides a processing chamber for receiving the ion beam 124 and leading the beam toward the workpiece 130. It will be appreciated that different types of end stations 116 may be employed in the implanter 110. The end station 116 in the illustrated example is a "serial" type end station, which supports a single workpiece 130 along the beam path for implantation. A "serial" type end station supports a single workpiece 130 along the beam path for implantation, wherein multiple workpieces 130 are implanted one at a time in serial fashion, with each workpiece 130 being completely implanted before implantation of the next workpiece 130 begins. In the case of a scanned beam serial type system, the workpiece 130 is mechanically translated in a first (Y or slow scan) direction while the beam is scanned to and fro in a second (X or fast scan) direction in order to impart the beam 124 over the entire workpiece 130.

Before and during ion implantation of the workpiece 130, it is desirable to monitor the ion beam to determine various characteristics and parameters thereof, including beam current, beam current density, beam current distribution and a general dosage of ions expected to be implanted into the workpiece for process control and other reasons. In addition, parameters such as beam angle and divergence, as well as size (beam width and height) can be monitored. Accordingly, a beam sampling system 155 and other associated hardware components are integrated into the end station 116 for monitoring and sampling the ion beam at a predetermined frequency, which can be on the order of 250 KHz, thereby providing a plurality of discrete beam current sample measurements for analysis thereof. In an exemplary system, one or more side Faraday cups 158A, 158B (also called sampling cups) are provided generally adjacent to the wafer 130 along the fast scan axis of the scanned ion beam 124, wherein one or more properties (e.g., a beam current) of the ion beam are sampled and measured as ion beam is scanned and passes over the one or more side Faraday cups. For example, the beam sampling system 155 receives a signal 164 comprising a plurality of sequential beam samples from the one or more side Faraday cups 158A, 158B and generally outputs the measured samples of the one or more properties of the ion beam 124 to the control system 154. The collection of these samples is synchronized with the scan current waveform provided to the scanner 136, as well as to the position of the scanned workpiece 130 to provide time and position dependent beam current information to the control system.

In the present example, the one or more side Faraday cups 158A, 158B are generally positioned adjacent to and outboard of the workpiece 130 (e.g., outside the circumference of the workpiece), along the path of the scanned ion beam 124 as it is scanned across the workpiece 130 and generally in the same plane as a plane of the workpiece. Thus, the scanned beam preferably has a width (the scan width) that extends beyond the dimension of the workpiece and is shaped to pass the entirety of the scanned ion beam 124 over the one or more side Faraday cups 158A, 158B positioned outside the circumference of the workpiece.

In addition, a tuning Faraday cup 170 is provided downstream of and "behind" the workpiece 130, wherein the beam sampling system 155 further receives high frequency samples from the tuning Faraday cup 170 and generally outputs the measurement of the one or more properties of the ion beam 124 to the control system 154. The tuning Faraday cup 170, for example, is conventionally utilized when the workpiece 130 is either not present (before an ion implantation cycle), entirely outside of the scan path (at either end of the slow scan sequence), or positioned so as to be at least partially outside of the scan path, such as when the workpiece is scanned to a position where the ion beam, or a portion thereof can reach the tuning cup positioned downstream from the workpiece 130. Once again, this sampled beam measurement is generally synchronized to the scan current waveform provided to the scanner 136, as well as to the position of the scanned workpiece 130 to provide a time and position dependent beam current profile of the ion beam. The beam sampling system 155 can include a presentation screen or graphic user interface for displaying the time and position dependent beam current waveform of the scanned ion beam, as well as the scan current waveform and other information of relevance to the system operator.

In addition to the side Faraday cups 158A, 158B, and the tuning Faraday cup 170, the beam sampling system can include input from the one or more traveling profilers 156. The traveling profiler 156, in this example, may comprise a current density sensor, such as a Faraday cup, for example, that measures the current density of the scanned beam. The current density sensor of the traveling profiler 156 moves in a generally orthogonal fashion relative to the scanned beam and thus typically traverses the width of the ribbon-shaped scanned ion beam. These profiler signals are typically generated before or after an implant cycle, wherein the profiler 156 is transported in front of the scanned ion beam to provide data and feedback to the ion implantation system during and/or after an ion implant cycle. Similar to the side Faraday cups 158A, 158B, and the tuning Faraday cup 170, the monitored and sampled beam current measurements provided by the traveling profiler(s) can be generally correlated to the scan current waveform provided to the scanner 136, as well as the position of the travelling profiler to provide a time and position dependent beam current profile of the ion beam.

A control system 154 is coupled to the beam sampling system 155 for providing communication, control, and/or adjustment the various components and subsystems of the ion implantation system 110, including: the ion source 120 and electrodes 125 associated therewith; the mass analyzer 127; the beam steering and focusing system 138; the scanning element 136; the parallelizer 139; the energy filter 157; and the charge neutralizer system 160, (i.e., collectively, any one or more of the beam optical elements). The control system 154 may comprise a computer, microprocessor, etc., and may be operable to store measurement values of beam characteristics (e.g., the beam current or density) and adjust parameters (e.g., bias voltages, gas pressures) applied to any one of the beam optical elements. Accordingly, any of these beam optical elements can be adjusted by the control system 154 to facilitate desired ion beam properties. For example, the strength and field generated in the mass analyzer 126 can be adjusted, such as by regulating the amount of electrical current running through field windings therein to alter the curvature of the path of the desired ion beam. In addition, or alternatively, the angle of implantation can be further controlled by adjusting the voltage applied to the steering element 138, for example, where it will be understood that the current density delivered to the wafer 130 can be a function of the angle of implantation (e.g., the relative orientation between the beam and the mechanical surface of the workpiece and/or the relative orientation between the beam and the crystalline lattice structure of the workpiece). In yet another alternative, instantaneous voltages applied to any one of the beam optical elements can be varied extemporaneously in response to beam current fluctuations detected by the beam sampling system 155. Therefore, in accordance with the present invention, the beam sampling system 155 and the control system 154 cooperate to provide in situ beam current sampling by which the beam current and/or beam current density is monitored and to further provide control of the ion implantation system. In one preferred embodiment, the beam sampling system 155 and the control system 154 can cooperate to create a control signal for interlocking, aborting or halting ion beam transport in the event that a significant beam current non uniformity event occurs. In another preferred embodiment, the beam sampling system 155 and the control system 154 can cooperate to create a control signal for adjusting power supply outputs to selectively vary voltages and currents applied to the various beam line components and beam optical elements of the ion implantation system, through iterative or incremental means.

Figure 2A:
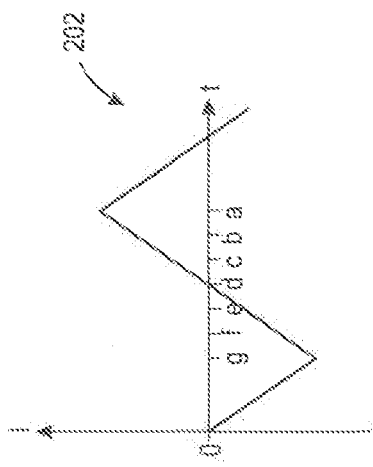
FIG. 2A is one embodiment of a scanner of the type that could be used in the ion implantation system of FIG. 1.

As previously noted, the implanter 110 may employ different types of scanning systems. For example, electrostatic scanning or magnetic scanning systems can be employed in the present invention. As illustrated in greater detail in FIG. 2A, the scanner receives a mass analyzed ion beam 124 having a relatively narrow profile (e.g., a so-called "spot" or "pencil" beam). The exemplary scanning system shown in FIG. 2A is a magnetic scanning system comprising a scanner region having a first magnetic pole 136a and a second magnetic pole 136b situated on either lateral side of the beam 124. The poles are separated by a gap comprising a vacuum, through which the beam path 124 passes. In one embodiment, the magnetic poles, 136a and 136b, may comprise electromagnetic coils. A current waveform operates to vary the current through coils 136a, 136b causing the beam 124 to scan back and forth in the X direction (the scan direction), creating an elongated "ribbon-type" beam (e.g., a scanned spot beam), having an effective X direction width that is preferably at least as wide as, and typically wider than, the workpieces being implanted. It will be appreciated that the scanned beam 124 is directed to the end station 16 such that the beam 124a strikes the wafer for implantation of ion therein. The scanned beam also strikes the measurement sensor(s) (Faraday cups) coupled to the beam sampling system 155. For purposes of the present description, all different types of scanning systems are equivalent and the magnetic scanning system of FIG. 2A is used for illustration only. Indeed, the present invention can e adapted to ion implant systems of differing architectures, including well-known 2D mechanical scan spot beam systems, as well as 1D mechanical scan ribbon beam systems.

Figure 2B:
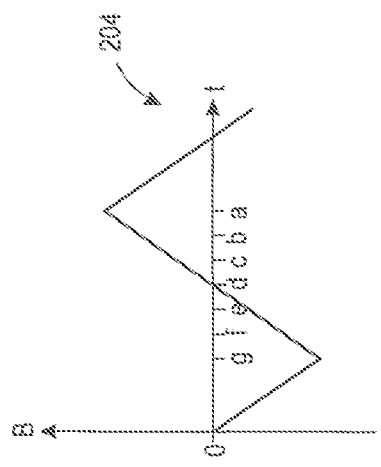
FIG. 2B is one embodiment of a triangular scanning current waveform for input into the scanner coils of FIG. 2A.

As will be understood, the magnetic poles 136a and 136b are coupled to a current source 149, configured to provide alternating currents to the magnetic poles 136a and 136b, as illustrated in the waveform diagram 202 in FIG. 2B. The time varying current between the magnetic poles forms a time varying magnetic field 204, as illustrated in a waveform diagram in FIG. 2C, extending outward from the coils across the beam path, by which the beam 124 is bent or deflected (e.g., scanned) along a scan direction (e.g., the X direction in FIG. 2A). When the scanner magnetic field is in the direction from the pole 136a to the pole 136b, (e.g., times "g"-"e" in FIG. 2C), the ions of the beam 124 are subjected to a lateral force in the positive X direction. When the poles 136a and 136b are subjected to zero current there is zero magnetic field in the scanner 136 (e.g., such as at time "d" in FIG. 2C) and the beam 124 passes through the scanner 136 unmodified. When the field is in the direction from the pole 136b to the pole 136a (e.g., times "a"-"c" in FIG. 2C), the ions of the beam 124 are subjected to a lateral force in the negative X direction).

Figure 2C:
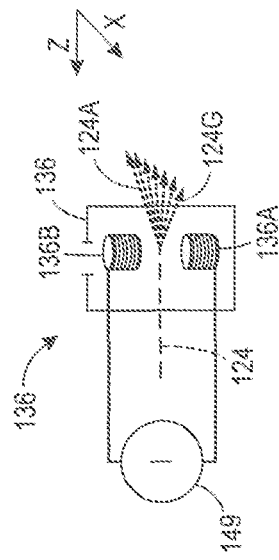
FIG. 2C is one embodiment of a resultant magnetic field waveform in the scanner of FIG. 2A as produced by the scanning current waveform of FIG. 2B.
Figure 2D:
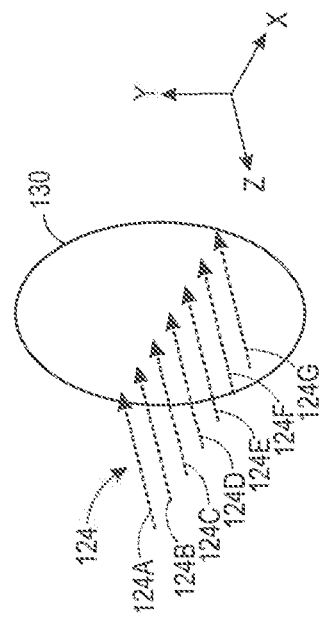
FIG. 2D is a perspective view illustrating a scanned ion beam striking a workpiece in the system of FIG. 2A at several discrete points in time.

FIG. 2D illustrates the scanned and parallelized beam 124 impacting the workpiece 130 at the corresponding times indicated in FIGS. 2B-2C. When the current through the poles is at a maximum and minimum (e.g., a negative maximum) the corresponding magnetic field strength will be at a maximum and minimum (e.g., a negative maximum) so that the beam can be found at the extremes of the beam path (e.g., at the far right and the far left edges beyond the circumference of the workpiece 130). Discrete points of the scanned beam 124a-124g are illustrated in FIG. 2D for scan currents at corresponding times "a"-"g" of FIG. 2B for a single generally horizontal scan in the X direction across the workpiece 130. It follows that when the scanner magnetic field is in the direction from the pole 136b to the pole 136a, the ions of the beam 124 are subjected to a lateral force in the negative X direction such that the scanned beam reverses the direction of the discrete points of the scanned beam 124g-124a illustrated in FIG. 2D to produce a single generally horizontal scan across the workpiece 130 in the negative X direction.

In order to gain a better understanding of the present disclosure, FIGS. 3 and 5 illustrate changes to the beam current density that may occur as the beam is scanned, which may be caused, for example, by changes in the cross-sectional shape of an ion beam, induced by the varying scan current through the coils as the ion beam is scanned over the surface of a workpiece. It will be appreciated that a change in the cross-sectional shape of an ion beam is just one way in which the beam current density of an ion beam may vary, though it is not intended to be a limiting example of how beam current density may be varied. It will also be appreciated that the change in cross-sectional shape of an ion beam, as referred to herein, may comprise any change to the cross-sectional shape of an ion beam. For example, changing the cross-sectional shape of the beam may comprise having the ion beam larger, smaller, wider, or narrower as well as in a symmetric or asymmetric manner.

As illustrated in FIG. 3, an exemplary ion beam path 302 is scanned over the workpiece 130 (as viewed from the trajectory of the ion beam 124) showing variations in the cross-sectional shape of the ion beam at particular locations along the path 302. In particular, the ion beam is illustrated at three different exemplary locations 306, 308, 310, respectively representing a location of the ion beam with respect to the workpiece 130 at three different time periods. The ion beam at each of the three exemplary locations is illustrated in phantom, representing three example cross-sectional shapes of the ion beam as the ion beam cross-sectional shape caries during scanning. As shown in FIG. 3, changes in an ion beam's cross-sectional shape may occur in any direction or directions. For example, the beam, and its profile may vary in height and/or width. As described above, the change in the cross-sectional shape of the ion beam 124 results in a change in the beam current density on the wafer 130.

Further, while the scan speed of the fast scan along the fast scan axis 314 in one embodiment is at a first scan frequency, any one of the beam optical elements may cause a change in the cross-sectional shape of the ion beam at a second frequency that is substantially greater than the first frequency. In one embodiment, the cross-sectional shape of the ion beam may vary along an axis having a different direction than the fast scan direction, thereby generating an ion beam having a modified effective height, for example, a beam variation that extends the shape of the ion beam in a direction substantially parallel to the slow scan direction. This feature is best understood in conjunction with FIG. 5, wherein a first beam shape 308a has a first dimension 316, while a second beam shape 308b has a second larger dimension 318, resulting in a beam having an enlarged dimension along the slow scan direction 312. The larger effective beam shape in the slow scan direction 312.

In FIG. 3, a plan view of the ion beam 124 is illustrated, being scanned over the workpiece 130. In this illustrated example, the workpiece is configured to be scanned along a slow scan axis 151 to be exposed to the spot ion beam 124 as it is scanned along a fast scan axis 154. The control system 154 is configured to control a speed of the workpiece 130 as it is scanned along the slow scan axis 151, a speed of the scanned ion beam as it is scanned along the fast scan axis 154, and a scan width of the scanned ion beam so that the entire surface of the workpiece 130 will be exposed to the ion beam in a predetermined manner (e.g. the predetermined scan pattern 150). It should be noted that the predetermined scan pattern 150 illustrated in FIG. 3 is an example having a generally constant scan width 152, and that various other scan patterns are contemplated as falling within the scope of the present disclosure. For example, the scan width 152 of the scanned ion beam 124 can be varied as the workpiece 130 traverses along the slow scan axis 151, such that the scanned ion beam reverses direction a predetermined distance from a circumference 156 of the workpiece (e.g., the scanned ion beam follows a geometry of the workpiece). Furthermore, the scan width 152 of the scanned ion beam 144 can be varied for other purposes, such as for attaining measurements of various properties of the ion beam via the side cups 158A and 158B, as has been discussed herein.

FIG. 3 illustrates a straightforward scanning of the beam 124 across the workpiece 130, wherein mechanical actuation (not shown) translates the workpiece 130 in the Y (slow scan) direction during X (fast scan) direction scanning by the scanner 36, whereby the beam 24 is imparted on the entire exposed surface of the workpiece 30. Prior to entering the scanner 36, the ion beam 124 typically has a width and height profile of non-zero X and Y dimensions, respectively, wherein one or both of the X and Y dimensions of the beam typically vary during transport due to space charge and other effects. For example, as the beam 124 is transported along the beam path toward the workpiece 130, the beam 124 encounters various electric and/or magnetic fields and devices that may alter the beam width and/or height or the ratio thereof. In addition, space charge effects, including mutual repulsion of positively charged beam ions, tend to diverge the beam (e.g., increased X and Y dimensions), absent countermeasures.

Also, the geometry and operating voltages of the scanner 136 provide certain focusing properties with respect to the beam 124 that is actually provided to the workpiece 130. Thus, even assuming a perfectly symmetrical beam 124 entering the scanner 136, the bending of the beam 124 by the scanner 136 changes the beam focusing, wherein the incident beam typically is focused more at the lateral edges in the X direction (e.g., 124a and 124g in FIG. 2D), and will be focused less (e.g., wider or more divergent) in the X dimension for points between the lateral edges (e.g., 124c, 124d, and 214e in FIG. 2D).

In order to gain a better understanding of the present disclosure, FIG. 4 illustrates an ideal time (or position) dependent beam current waveform measured over the course of a single beam scan path. FIG. 4 depicts an ideal situation, wherein it can be seen that the beam current denoted by trace 166 remains relatively constant and uniform as the ion beam traverses the workpiece 130. The beam current ramps upward or downward at the end of each scan as the beam travels beyond the respective side Faraday cups 158A, 158B. This beam current waveform can be represented in the form of a predicted beam current waveform by exposure of the ion beam to side Faraday cups 158A, 158B, so as to provide a measure of the beam current that should be expected across the workpiece over a given scan path. Alternatively, the beam current waveform can be provided by exposure of the ion beam to the traveling profiler 156 or one of the side tuning Faraday cup 170 shown in FIG. 1.

The present disclosure contemplates that the ideal beam current illustrated in FIG. 4 is typically not representative of the actual beam current that is presented to the workpiece during the typical operation of an ion implantation system. For example, as previously noted, as the beam 124 is transported along the beam path toward the workpiece 130, the beam 124 encounters various electric and/or magnetic fields and devices that may alter the beam shape or may influence the beam uniformity in various ways. In addition, space charge effects, including mutual repulsion of positively charged beam ions, tend to diverge the beam absent countermeasures. It has also been found that the presence or lack of presence of the wafer at specific positions in the end station can create perturbations in the ion beam, and the current density associated therewith. Particle contamination can also create short term fluctuations in beam profiles and/or beam current. Thus, in reality, the ion beam current, the current density and/or the current distribution is non-uniform and can fluctuate throughout a given scan path, or multiple scan paths throughout an implant cycle, and also across the different ion implant cycles of different workpieces. Embodiments of the present invention related to apparatus and methods for controlling ion beams contemplate integration of a beam sampling system and a control system to control an ion beam in an ion implanter based on the detection of a plurality of beam current measurements of the ion beam and an analysis of the plurality of samples to identify a variation or fluctuation of the ion beam current based upon the plurality of beam current measurements. Identified variations in excess of a certain threshold, either absolute or relative, which is to say in comparison to previous beam current measurements, can yield a control signal for halting the ion implant system or at least aborting transport of the ion beam. The system may also include an adjustment component to adjust the ion beam in response to an identified variation in beam current to reduce the variation, in an effort to reduce the variation of the ion beam below a threshold level in situ, during an ion implant procedure. Thus, the control system 154 is configured to generate a predetermined control signal for aborting or performing adjustment of a parameter in the ion implanter when the ion beam variation is above a threshold.

In addition, it is understood that there are many factors that can influence the ion beam current distribution on the target surface. For example, ion implanters of conventional design exhibit poor transmission at low-energy levels. Such poor transmission can vary depending on the dopant. Moreover, incorporating different principles of ion beam optics can solve this low-energy transmission problem but can, in turn, create other problems related to beam uniformity. In another example, the combination of high energy transport with end-of-line deceleration, as described hereinabove, may enable the ion beam to be extracted and transported at a higher energy to mitigate space charge effects and to achieve higher beam current levels, but may yield other issues related to spatially non-uniformity that causes ions to impact the substrate with a wide distribution of angles of incidence relative to the wafer surface. In yet another example, ion implantation with molecular ions as the species being implanted (versus monomer ions) introduces its own unique set of implant nonuniformities. Other examples that yield beam current nonuniformities include beam duty factor control, quenching of electrode arcs, power supply modulation, among others.

The fact that current nonuniformities are inherent in ion implantation systems yields predictable non-uniformity (PNU) specifications for particular beam current or ion implant specifications. Thus, a PNU or multiple PNU's can be determined through experimentation, empirical data and otherwise, as an integral characteristic in certain ion implantation systems and under certain implant conditions. Thus, there may be some predictable non uniformity (PNU) characteristic related to beam current that can be identified as being acceptable in certain ion implantation systems and under certain implant conditions.

The present invention can operate to provide control of the ion implantation system in accordance with and within these PNU constraints and/or when beam current variations or fluctuations are identified as beyond the scope of predetermined threshold levels. FIG. 5 provides a simplistic illustration of the changes and fluctuations that may occur to the beam current or density due to exemplary changes in the beam current (as may be caused by changes in the cross-sectional shape of an ion beam, among other variables), as the ion beam is transported through the beamline, passes through the multiple optical elements of the beamline as described herein, and is implanted into the surface of the workpiece. As shown in FIG. 5, changes in an ion beam's cross-sectional shape may occur in any direction or directions. As described above, the change in the cross-sectional shape of the ion beam 121 (e.g., through focal variation) results in fluctuations in the beam current, current density and/or current distribution. These fluctuations will be seen as an inconsistency, nonuniformity or spike in the beam current, such that the ideal beam current waveform relative to time or position illustrated in FIG. 4 will include non-uniformities that could include upward or downward trending slopes indicating a gradual nonuniformity in beam current, or a sharp upward or downward spike, indicating a fast impulse event affecting the beam current where it can be seen that, due, at least in part, to fluctuations of the total beam current I, the profiled beam current is modulated. These changes, which may manifest themselves as a non-uniformity or a fluctuation in beam current may result from various inconsistencies, variations or irregularities that may occur during transport of the ion beam during the implant cycle, ranging from uncontrolled changes in the process environment as may be caused by variations in temperature, vacuum levels, particle excursions, unexpected power supply outputs, hardware interruptions or failures affecting one or a plurality of the optical elements positioned along the beamline, any and all of which could affect beam current at a given time. Such variations in beam current can be influenced by various characteristics of the ion beam, including, but not limited to: beam angle; beam shape; beam divergence; and beam parallelism, which all can lead to inconsistent and non-uniform beam current densities at the wafer.

For purposes of discussion and illustration, beam current fluctuations and or nonuniformity have been presented and will be discussed in the context of changes in beam shape. However, It will be appreciated that a change in the cross-sectional shape of an ion beam is just one way in which the current, current density and/or distribution of an ion beam may vary, such that beam shape is not intended to be a limiting example of how beam current or beam current density or distribution may vary or fluctuate. It will also be appreciated that the change in cross-sectional shape of an ion beam, as referred to herein, may comprise any change to the cross-sectional shape of an ion beam. For example, changing the cross-sectional shape of the beam may comprise changes that make the ion beam larger, smaller, wider, or narrower, in a symmetric manner or an asymmetric manner, and in a systematic or nonsystematic manner.

In one example, the cross-sectional shape of the ion beam may vary symmetrically along an axis having a direction substantially transverse to the fast scan direction of the ion beam, thereby generating a time-averaged ion beam having a modified effective height. For example, in a case where a beam focusing element inadvertently extends the shape of the ion beam in a direction substantially parallel to the slow scan direction, a time-averaged ion beam having a greater height will result. This example is best understood in conjunction with FIG. 5, wherein a first beam shape 308a has a first dimension 316, while a second beam shape 308b has a second larger dimension 318, resulting in a time-averaged beam having an enlarged dimension along the slow scan direction 312. Conversely, in a case where the ion beam is inadvertently truncated in shape in a direction substantially parallel to the slow scan direction, a time-averaged ion beam having a smaller height will result, as illustrated by beam shape 308c, resulting in a time-averaged beam having an small dimension along the slow scan direction 312. Turning back to the exemplary ion beam path 302 scanned over the workpiece 130 (as viewed from the ion beam 121), as illustrated in FIG. 3, these variable beam shapes can result in variations in the cross-sectional shape of the ion beam at particular locations along the path 302. In particular, the ion beam is illustrated at three different exemplary locations 306, 308, 310, respectively representing a location of the ion beam with respect to the workpiece 130 at three different time periods. The ion beam at each of the three exemplary locations is illustrated in phantom, representing three example cross-sectional shapes of the ion beam as one or more beam focusing/shaping elements vary the ion beam cross-sectional shape during scanning.

Figure 6:
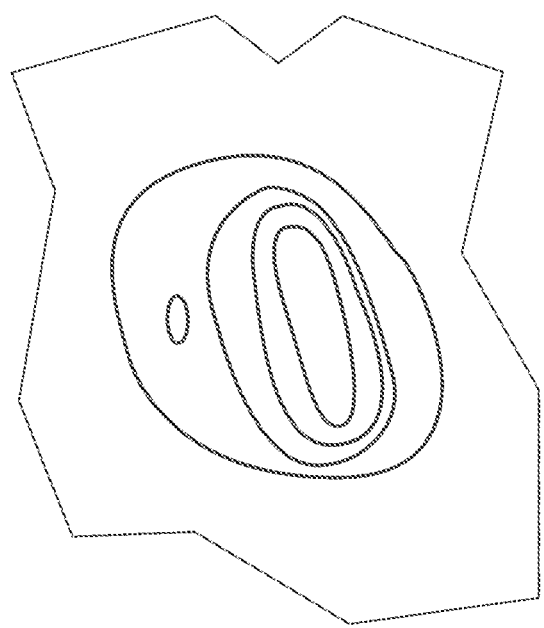
FIGS. 6 and 7 illustrate exemplary singular samples of a spot beam at discrete periods of time, wherein the beam has a nonuniform current density thereacross.
Figure 6A:
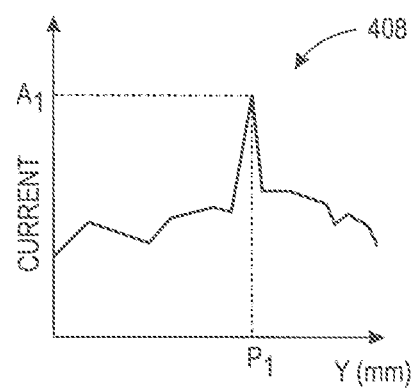
FIGS. 6A and 7A illustrate the ion beam profiles associated with the cross-sectional ion beam shapes of FIGS. 6 and 7, respectively.
Figure 7:
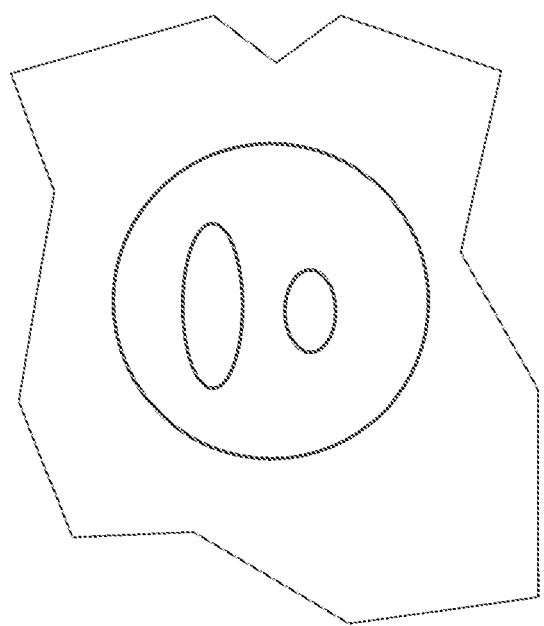
Figure 7A:
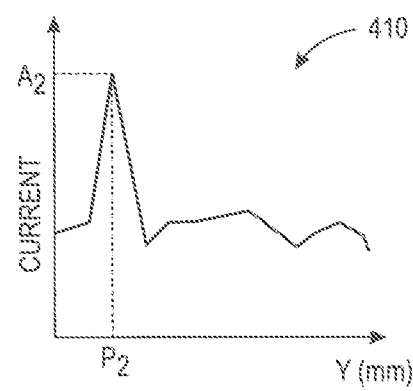

Moving on to FIGS. 6-7, more realistic, asymmetric, nonsystematic fluctuations in beam shape and beam current density distribution are illustrated. As stated above, variations in the cross-sectional shape of an ion beam will provide a plurality of different instantaneous beam current densities having different beam profiles for the ion beam over time. For example, a first cross-sectional beam shape may have a first beam profile having a current "spike" at a first location along the beam profile, while a second cross-sectional beam shape may have a second beam profile having a current spike at a second location, different than the first location, along the beam profile. Further, a third cross-sectional beam shape may have a third beam profile having multiple spikes at a multiple locations along the beam profile. For example, FIGS. 6 and 6A illustrate a beam current profile 408 associated with the first ion beam shape, comprising a current peak/spike having an amplitude $A_1$ at a location $P_1$. FIGS. 7 and 7A illustrate a second ion beam shape incident on a workpiece, wherein a beam current profile 410, associated with the second ion beam shape comprises a current peak/spike having an amplitude $A_2$ at a location $P_2$. Rapid changes to the cross-sectional shape of the ion beam, which may be caused by various factors associated with the ion implantation system, may cause the beam current density to change between different beam profiles over the course of a fast scan across the wafer. Therefore, a rapidly changing cross-sectional shape of the ion beam can expose a workpiece to a number of different and varying beam current densities having different and varying beam current profiles.

As previously noted, it is desirable to monitor the ion beam before and during ion implantation to determine various characteristics and parameters of the ion beam for process control and other reasons, including beam current, beam current density, beam current distribution and a general dosage of ions expected to be implanted into the workpiece. As such, the present invention includes hardware and associated electronics and control systems for sampling the ion beam at a predetermined frequency, on the order of 250 KHz, to provide a plurality of discrete beam current sample measurements as the beam is scanned across the workpiece. It will be noted that this relatively high frequency sampling rate is not required, and that sampling rates as low as 5 Khz or even 500 hz might be useful in some applications, so long as many samples can be measured compared to the scanning of the beam during implant. In the exemplary system disclosed herein, the side sampling cups and the tuning cup are provided, wherein beam current is sampled and measured as the spot ion beam passes thereover. The output measurements from these cups are delivered to the beam sampling system, which generally includes a display element 155a for providing a graphic representation of the beam current waveform in real time. The monitored samples are synchronized to the scan current waveform input to the scanner (as well as to the position of the scanned workpiece) to provide a time and position dependent beam current profile of the ion beam that can be viewed in real time. Synchronizing the monitored sampling with the scan current waveform also provides information relative to the direction of the scan, which may be of use in determining a prescribed control output.

Figure 8:
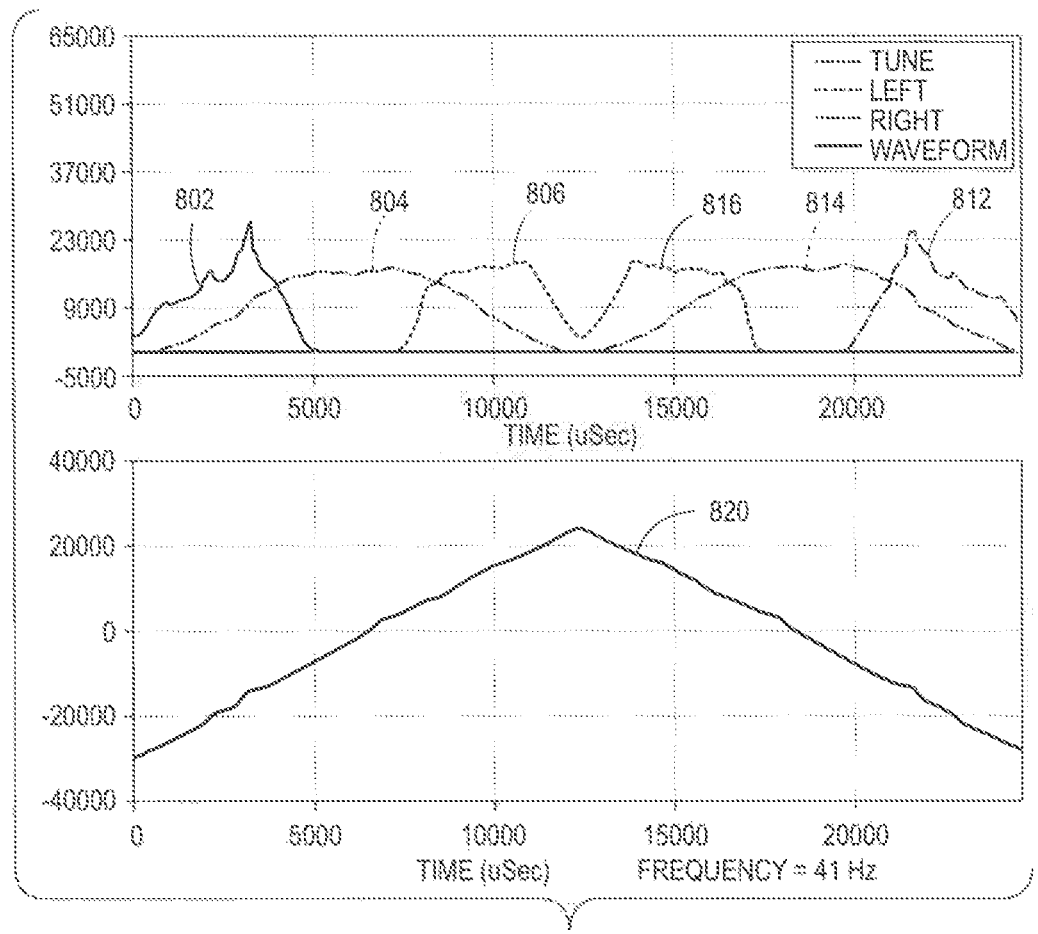
FIG. 8 is an exemplary screen capture from a graphic user interface device, showing waveforms generated by the left and right side Faraday cups, as well as the waveform generated by the tuning cup and further showing the scan current waveform input to the scanner.

An exemplary screen capture from the display element 155a is provided in FIG. 8, showing the waveforms generated by the left and right side Faraday cups (802, 806 in a left to right scan of the wafer, and 816, 812 in a right to left scan of the wafer) in combination with the waveform generated by the tuning cup 804, 814. FIG. 8 also shows the scan current waveform 820 input to the scanner. These waveforms show the beam current samples in the form of a waveform as the beam is scanned in a first direction from time 0 to 12500 uSec (when the scan waveform has a positive slope) and as the beam is scanned in a second direction opposite to the first direction from time 12500 uSec to 25000 uSec (when the scan waveform has a negative slope). It will be understood that the present invention applies equally to scan times and frequencies in all ranges. By synchronizing the monitored beam samples with the scan current waveform, a time and position dependent beam current waveform of the ion beam can be displayed. Synchronizing the monitored sampling with the scan current waveform also provides information relative to the direction of the scan, which may be of use in determining a prescribed control output in accordance with the present invention.

The beam current waveform of the ion beam as illustrated in FIG. 8 demonstrates a relatively stable uniform beam current waveform captured by the tuning cup 804, 814 sandwiched between relatively nonuniform beam current waveforms captured by the left side cup 802, 812 and captured by the left side cup 806, 816. It will be seen that the beam current waveform of the ion beam as illustrated in FIG. 8 demonstrates relatively symmetric beam current waveforms captured as the beam is scanned along the first direction and then in the second, reverse, direction. For example, the waveforms 806, 816 captured by right side cup demonstrate a slight increase in beam current as the beam travels from the left edge of the side cup to the right edge, and then a substantially equivalent slight decrease in beam current as the beam reverses its direction of travel from the right edge of the side cup to the left edge. In this case, namely the waveforms 806, 816 captured by right side cup, the variation of beam current can be analyzed and it may be determined that the variation is within predicted uniformity measurements, or the PNU as described hereinabove, such that no corrective action would be required via the control system. However, in view of the symmetric characteristic of the current variation, showing a heightened current density measurement at the extreme right side of the side cup, the control system might identify a systematic problem related to the scanner operating within a defined scan current range (the current range associated with scanning of the ion beam to the far right side of the scan range). In this case, the control system can be configured to generate a corrective signal to one or more of the beam optical elements. Alternatively, the control system can generate a lockout signal to prevent further implantation of the wafer.

In another example, the waveforms 802, 812 represent the current signals captured by the left side cup. These waveform segments demonstrate a significant spike in beam current as the beam travels from the left edge of the left side cup to the right edge (waveform 802), and then a substantially equivalent spike in beam current after the beam has reversed its direction of travel from left-to-right to right-to-left (waveform 812). In this case, namely the waveforms 802, 812 captured by the left side cup, the variation of beam current can be analyzed and it could be determined that the current spike is outside of threshold beam uniformity measurements such that corrective action would be required via the control system. The beam current sampling can also be analyzed and used to abort a given implant cycle in cases where the beam current drift, variation and/or fluctuation exceeds a predetermined threshold level as an absolute value of beam current, or as a relative value in comparison to a previous current sample or samples. As an illustrative example, the control system can be configured to generate a lockout signal to prevent further implantation of the wafer, or to provide a dynamic feedback signal to one or more optical elements for reducing the beam current fluctuation to within an acceptable range.

Figure 9:
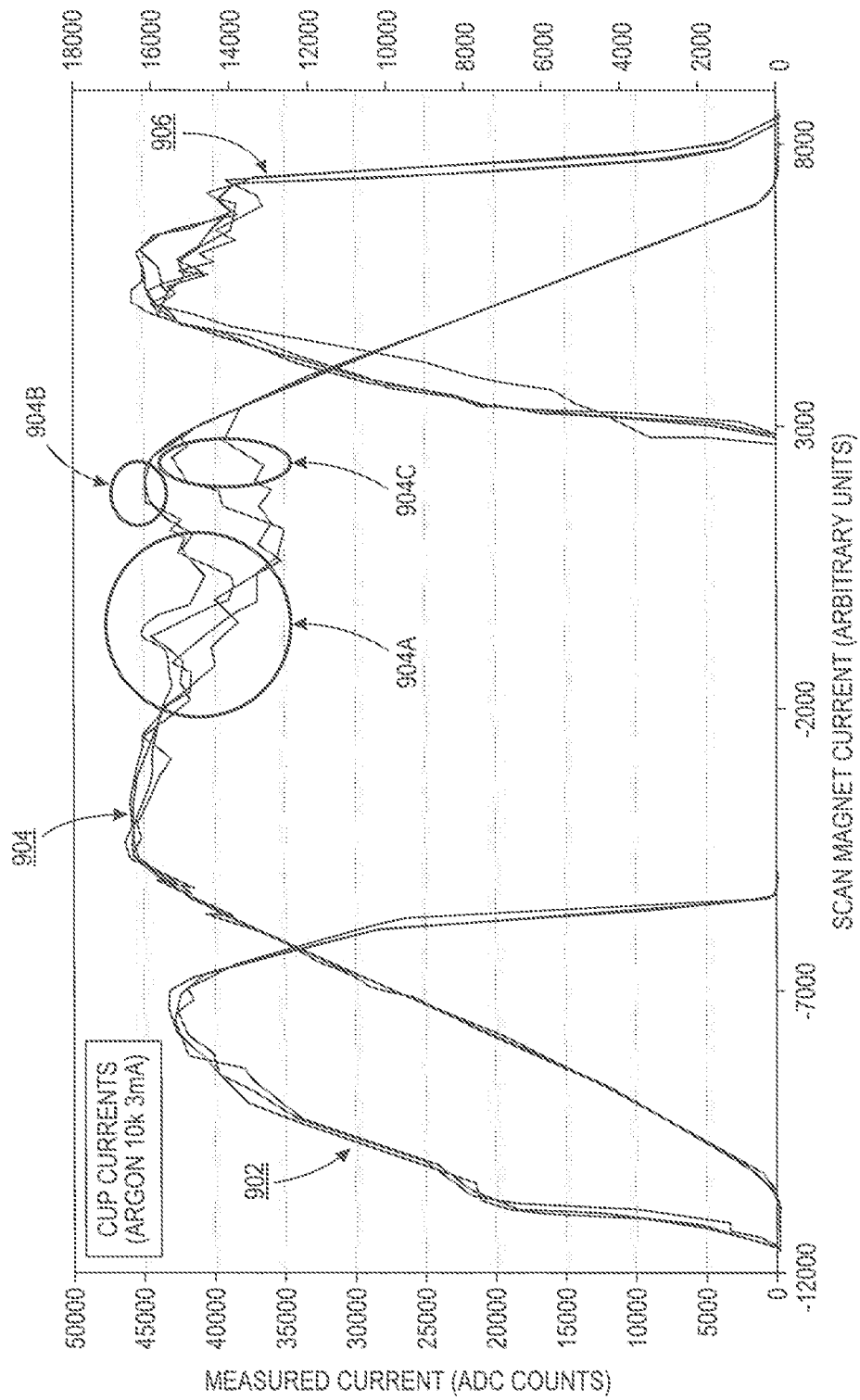
FIG. 9 is an exemplary screen capture from a graphic user interface device, showing waveforms generated by the left and right side Faraday cups, in combination with the waveform generated by the tuning cup as a function of position of the beam current sample on the wafer.

Another exemplary screen capture from the display element is provided in FIG. 9, showing multiple waveforms 902, 906 generated by the left and right side Faraday cups, in combination with multiple waveforms 904 generated by the tuning cup as the beam is scanned multiple times in a first direction and in a second direction. In the case of FIG. 9, the captured waveforms are shown overlayed and folded on one another as the beam travel in a first direction and in an opposite second direction, as opposed to the serial layout of the waveforms as illustrated in FIG. 8. The plurality of beam current measurements are synchronized with the scan current waveform such that a time and position dependent beam current waveform of the ion beam current is displayed. In addition, by overlaying these waveforms one over one another while synchronizing the monitored beam samples with the scan current waveform, a scan direction dependent beam current waveform can be generated. Thus, in an exemplary embodiment, the display element 155a is preferable provided in the form of a color display screen, wherein waveforms associated with the right to left scan motion of the beam can be displayed in a first color, and waveforms associated with the left to right scan motion of the beam can be displayed in a second color.

In the representative screen capture of FIG. 9, it can be seen, for example, that significant beam current fluctuations occur near the middle portion 904a of the waveform 904 captured by the tuning cup. This could be associated with a so-called zero field anomaly as has been documented and is a well-known problem associated with magnetic scanner systems. Alternatively, the fluctuations represented in portion 904a may be associated with other factors associated with any of the various beam optical components in the beamline. In addition, the representative screen capture of FIG. 9 demonstrates, for example, that waveform segments 904c associated with the beam current as the beam traverses the right side of the tune cup varies significantly in as opposed to waveform segments 904b, which are also associated with the beam current as the beam traverses the right side of the tune cup. These different waveform sections may represent a contrast in the time periods when the beam travels in the second direction as compared to beam travel in the first direction. The variations between waveform segments 904b and waveform segments 904c could indicate a problem, for example, wherein the scanned beam strikes an area at the right side of the endstation that causes outgassing (i.e., the beam strikes photoresist contaminant present on the right side of the end station). As such, the beam current may be negatively impacted during a brief outgassing excursion extending for a time period as the beam reverses direction but not so long as to extend into the subsequent beam scan. These outgassing excursions can cause pressure surges or drops within the endstation, which might manifest themselves as inconsistencies in beam uniformity during a relatively fixed time period from one scan pass to the next. It will be understood that such nonuniformities and/or fluctuations in beam current may be associated with other factors associated with the various beam optical components in the beamline, particularly in the beam optical components downstream from the scanner in sections thereof associated with motion of the beam in the second direction. The present invention enables sampling and high-level analysis of the beam current, coupled with control of the ion implantation system to include the generation of corrective feedback signals as input to one or more of the beam optical elements. Alternatively, the control system can generate a lockout signal to prevent further implantation of the wafer so that supplementary corrective action can be taken.

It will be appreciated that the beam current fluctuations and/or beam current variations captured by the monitoring and sampling system of the present invention can be used as input to a control system configured to operate the ion implantation system. In the absence of the control system, the ion beam may experience a periodic variation in beam current made up of high or low beam current or ion dose spikes. These spikes may be sporadic or may be comprised or periodic variations in beam current that may be generated from different sources within the ion implanter. For example, particle contaminants or fluctuations in beam shape may induce unexpected, rapid and abrupt fluctuation (modulation) in beam current. Alternatively, mechanical sources such as vibrations within a beam processing component such as a lens may induce systematic and repeatable fluctuations (modulations) in beam current. Notably, fluctuations within a beamline component such as an electrostatic component, a magnetic component, or a mechanical component may cause changes in ion beam intensity at the substrate. In some cases, the beam position, beam size, and/or beam divergence and direction may fluctuate as the ion beam propagates through the beamline, resulting in a fluctuation (modulation) in beam current.

The control system may address these fluctuations by detecting beam variations and triggering a control signal that causes the ion implantation system to interlock and/or shutdown to discontinue substrate processing. Alternatively, control system may address these fluctuations by detecting beam variation and triggering a control signal that enables a diagnostic routing that induces adjustments to one or more power supplies associated with or more beam optical components to avoid delivering non-uniform ion dose to the substrate. In particular, in various embodiments, the system is configured to dynamically adjust parameters of the ion implanter to reduce or eliminate the beam current modulation, resulting in delivery of more uniform ion dose to a substrate. Accordingly, a dynamically adjusted ion beam may be delivered to the substrate, preferably resulting in a uniform ion dosage in which the ion dose per unit area is uniform across the substrate.

As will be understood, the control system 154 of FIG. 1, for example, is configured to analyze the beam current density profile and correlated position of the ion beam to determine the ion beam current density delivered to the substrate at a respective correlated position, and to further calculate a predicted dose uniformity, wherein the controller is further configured to perform a corrective action if the predicted dose uniformity is inconsistent with an implant uniformity criterion. In one exemplary embodiment, the controller 154 may be configured to adjust any one of the beam optic elements, thereby dynamically modifying the ion beam current or current density in real time or in situ during the course of an ion implant cycle. Likewise, the controller may be further configured to halt the implantation if the adjustment of the beam optics fails to correct an identified inconsistency or nonuniformity in the implant uniformity criterion.

Figure 10:
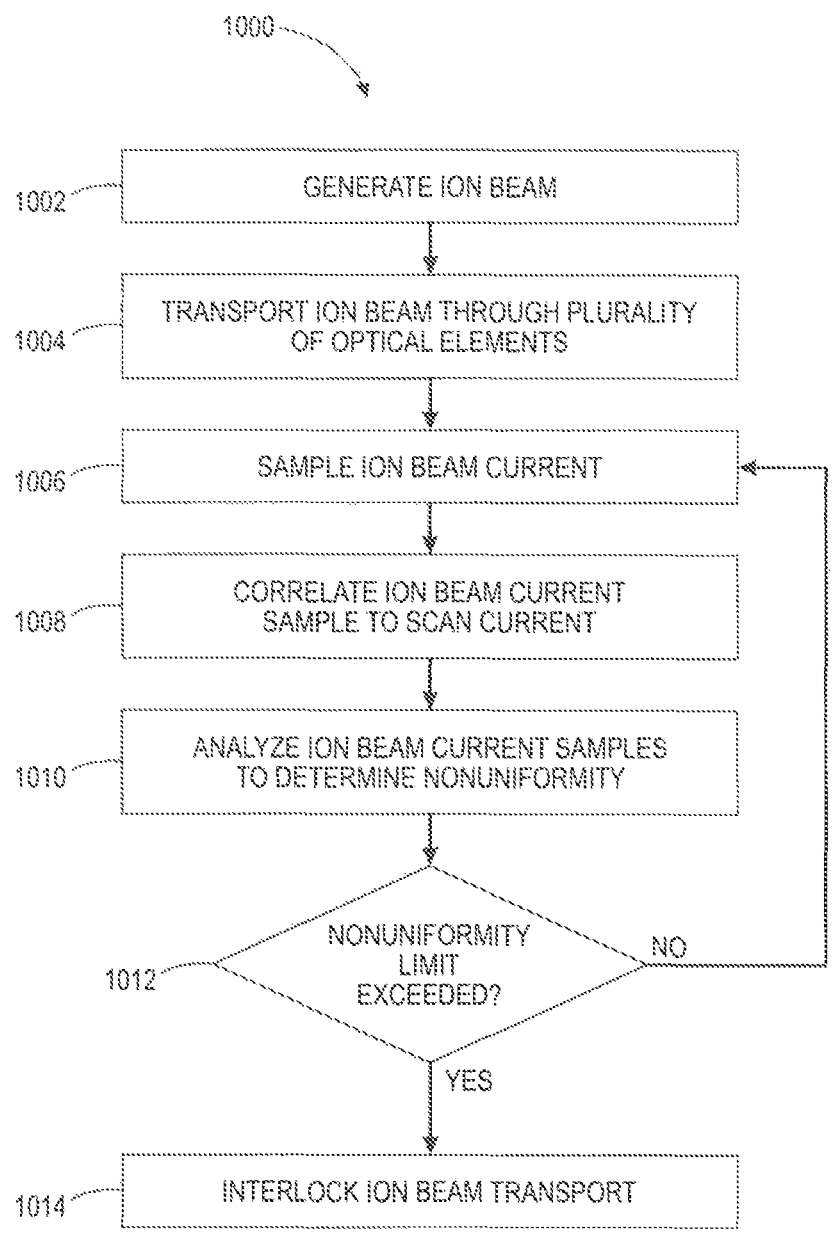
FIG. 10 illustrates a methodology for analyzing and monitoring beam current samples for control of an ion implantation system, in accordance an aspect of the present invention.

Accordingly, as illustrated in FIG. 10, the present disclosure further provides a method for uniformly implanting ions into a workpiece. It should be noted that while exemplary methods are illustrated and described herein as a series of acts or events, the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated. Those skilled in the art will understand and appreciate that a methodology could alternatively be represented as a series of interrelated states or events, such as in a state diagram.

FIG. 10 depicts a first exemplary flow diagram 1000 for ion implantation system control and control of beam current uniformity in accordance with the present invention. The flow starts with block 1002 where an ion beam is generated. At block 1004, the ion beam is transported through a plurality of beam optical elements, including a scanner (electrostatic or magnetic), and may further include ion source extraction and suppression electrodes, a mass analyzer, a resolving aperture, beam focusing elements, scanner electrodes or other deflection system, a parallelizing system an angular energy filter and/or a charge neutralization system. At block 1006, a plurality of beam current measurements are sampled to provide a plurality of discrete beam current measurements. In one exemplary embodiment, the beam current measurements may be performed at a rate of about 250 KHz, or more. These plurality of discrete beam current measurements are correlated with the scan current at step 1008 to provide a positional information for each discrete beam current measurement. This beam current samples are collected as a function of the scan current to provide a beam current and location. Act 1006, for example, occurs concurrent with the scanning of the ion beam such that the side Faraday cups and tuning Faraday cup are exposed to the ion beam based on the position of the ion beam and the physical dimensions of the workpiece. As such, the beam current density profile is correlated to a position of the ion beam with respect to the workpiece, the plurality of side Faraday cups and tuning Faraday cup in act 1008.

The flow then proceeds to block 1010, where an analysis of the ion beam sample measurements is performed. At step 1012, a decision is made as to whether a present current sample exceeds a threshold value relative to a preceding current sample. If the determination is no, and that threshold has not been exceeded, the flow proceeds, and a subsequent beam current measurement is sampled and analyzed. If the determination is yes, and that threshold has been exceeded, the flow proceeds to block 1014, wherein the ion implantation process is interlocked or halted.

Figure 11:
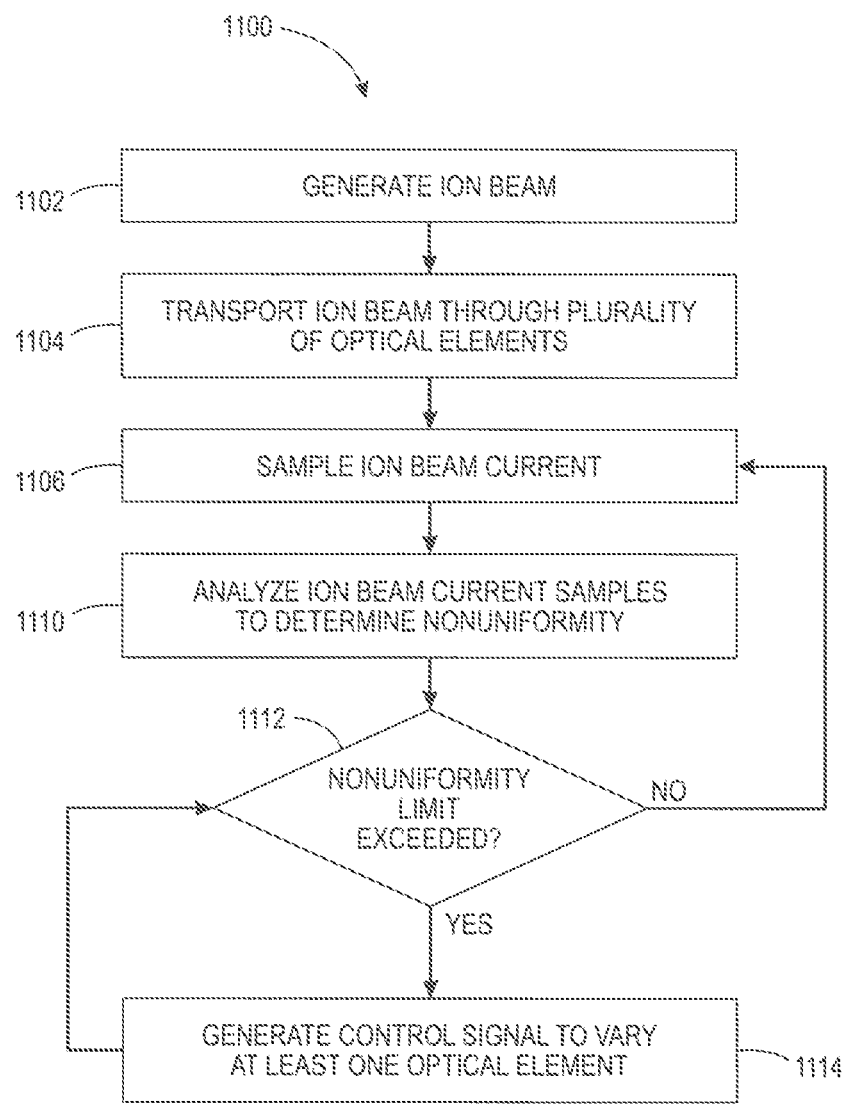
FIG. 11 illustrates another methodology for analyzing and monitoring beam current samples and for uniformly implanting ions in a scanned ion beam implanter, in accordance with another aspect of the present invention.

FIG. 11 depicts an alternative exemplary flow diagram 1100 for ion implantation system control and control of beam current uniformity in accordance with the present invention. Similar to the flow diagram depicted in FIG. 10, the flow starts with block 1102 where an ion beam is generated. At block 1104, the ion beam is transported through a plurality of beam optical elements in the same manner as described with respect to FIG. 10. At block 1106, a plurality of beam current measurements are sampled in synchronism with the scan current of the scanning system (block 1108) so that the position of the beam current sample can be determined. The flow then proceeds to the block 1110, where an analysis of the ion beam sample measurements can be performed. At step 1112, a decision is made, based on the analysis performed at block 1110, as to whether a present current sample exceeds a threshold value relative to a preceding current sample. If the determination is yes, and that threshold has been exceeded, the flow proceeds to block 1114, wherein a control signal is generated to vary the bias voltage applied to at least one of the optical elements on the beamline. As such, in accordance with this process flow, the ion beam can be dynamically modified if the dose uniformity is inconsistent with a predetermined implant uniformity criterion. As depicted in FIG. 11, it will be understood that ion the non uniformity threshold decision continues by circulating back to steps 1112 and, in some cases, step 1106 to re-measure and then reanalyze the signals, after the control signal is generated such that if the adjustment of the beam optics fails to correct the violation of the implant uniformity criterion, the implantation is halted in a manner as set forth with respect to FIG. 10. Thus, multiple attempts for generating the proper control signal to appropriately adjust parameters of the ion implanter can be made, wherein if the number of attempts exceeds a predetermined number, the flow can proceed to a step where the ion implantation process is interlocked or halted.

As will be understood, the present invention can be utilized to analyze the beam current density profile and correlated position of the ion beam over a plurality of workpieces to determine beam current uniformity of the ion beam at the respective correlated position, wherein the controller is further configured to perform a corrective action if the dose uniformity violates an implant uniformity criterion. The present invention may be further utilized to adjust various beam optical elements, thereby dynamically modifying the ion beam if the dose uniformity violates an implant uniformity criterion. Likewise, the invention can be further utilized to halt the implantation process if the adjustment of the optical elements fails to correct the implant uniformity criterion.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for controlling ion beam uniformity in an ion implantation system, the method comprising:
generating an ion beam;
transporting the ion beam toward a workpiece;
scanning the ion beam in first and second scan directions along a first axis to generate a scanned ion beam in response to a scan current waveform;
providing at least one beam optical element configured to selectively steer and/or shape the ion beam as it is transported toward the workpiece;
sampling the scanned ion beam for providing a plurality of ion beam current samples as the ion beam is scanned;
synchronizing the ion beam current samples with the scan current waveform to provide position and scan direction information corresponding to the scanned ion beam for producing a time, position and scan direction dependent beam current waveform;

analyzing the plurality of ion beam current samples to detect nonunifomity therein; and generating a control signal in response to the analyzing step.

2. The method of claim 1, wherein the control signal includes a signal for interlocking ion beam transport in the ion implantation system.

3. The method of claim 1, wherein the control signal includes a signal for varying an input to the at least one beam optical element to control variations in an effective cross-sectional shape of the ion beam.

4. The method of claim 1, wherein:

the analyzing step includes comparing at least one of the plurality of ion beam current samples to previous ion beam current samples; and the generating step is initiated when a detected nonuniformity in the plurality of ion beam current samples exceeds a predetermined threshold.

5. The method of claim 1, wherein:

the analyzing step includes comparing at least one of the plurality of ion beam current samples to a predicted nonuniformity specification; and the generating step is initiated when a detected nonuniformity in the plurality of ion beam current samples exceeds the predicted nonuniformity specification.

6. The method of claim 1, further comprising the step of storing the plurality of ion beam current samples and the position of the ion beam for a plurality of scans across a plurality of workpieces.

7. The method of claim 1, wherein the at least one beam optical element varies an effective cross-sectional shape of the ion beam.

8. An ion implantation system, comprising:

an ion source for generating an ion beam;

a beamline configured to transport the ion beam along a beam path toward an end station configured to hold a workpiece;

a plurality of beam optical elements situated along the beamline, configured to selectively steer, deflect and/or shape the ion beam as it is transported toward the workpiece;

a scanner configured to receive a scan current waveform for scanning the ion beam in first and second scan directions along a first axis to generate a scanned ion beam in response to the scan current waveform;

a beam sampling system configured to sample the scanned ion beam to provide a plurality of ion beam current samples as the beam is scanned; and a controller configured to synchronize the plurality of ion beam current samples to the scan current waveform to provide position and scan direction information corresponding to the scanned ion beam for producing a time, position and scan direction dependent beam current waveform, and further configured to analyze the plurality of beam current samples to detect a nonuniformity thereof for generating a control signal in response to the nonuniformity.

9. The ion implantation system, of claim 8, wherein the beam sampling system further comprises a plurality of Faraday cups configured to intersect the ion beam.

10. The ion implantation system, of claim 9, wherein the plurality of Faraday cups includes at least one side Faraday cup positioned adjacent to a periphery of the workpiece.

11. The ion implantation system, of claim 9, wherein the plurality of Faraday cups includes at least one tuning Faraday cup positioned downstream of the workpiece along the beam path.

12. The ion implantation system of claim 8, wherein the controller is further configured to correlate a position of the ion beam relative to the workpiece.

13. The ion implantation system of claim 12, further comprising a storage device configured to store a beam current density profile associated with the correlation of the position of the ion beam relative to the workpiece.

14. The ion implantation system of claim 8, wherein the controller is further configured to generate the control signal in response to a detected nonuniformity in the plurality of ion beam current samples exceeding a predetermined threshold.

15. The ion implantation system of claim 14, wherein the control signal includes an interlock signal for discontinuing ion beam transport in the ion implantation system.

16. The ion implantation system of claim 14, wherein the control signal includes a signal for varying an input to at least one of the plurality of beam optical elements to control variations in an effective cross-sectional shape of the ion beam.

17. The ion implantation system of claim 8, wherein the plurality of beam optical elements vary an effective cross-sectional shape of the ion beam.

18. A method for uniformly implanting ions into a workpiece, the method comprising:

generating an ion beam;

transporting the ion beam along a beam path;

providing at least one beam optical element configured to act on the ion beam as it is transported along the beam path;

scanning the ion beam in first and second scan directions along a first axis to produce a scanned ion beam in response to a scan current waveform;

sampling the scanned ion beam to detect fluctuations in beam current density by obtaining a plurality of different ion beam current density samples as the ion beam is scanned across a surface of the workpiece;

correlating the plurality of different ion beam current density samples with the scan current waveform to provide a position and scan direction of the ion beam with respect to the workpiece for producing a time, position and scan direction dependent beam current waveform;

analyzing the plurality of different ion beam current density samples with the position and scan direction of the ion beam to determine the ion beam current density at a respective correlated position and scan direction;

comparing a present ion beam current density sample at its corresponding position and scan direction to a preceding ion beam current density sample at its corresponding position and scan direction; and creating a control signal in response to the comparing step.

19. The method of claim 18, wherein the control signal includes a signal for halting the implantation if the comparing step yields a present ion beam current density sample value that is beyond a threshold value.

20. The method of claim 18, wherein the control signal includes a signal for adjusting a bias voltage applied to at least one beam optical element configured to act on the ion beam as it is transported along the beam path.

21. The method of claim 18, wherein the control signal includes a signal for halting the implantation if the comparing step yields an ion beam current density sample value that is inconsistent with a predicted an ion beam current density waveform.

22. The method of claim 18, wherein the control signal includes a signal for adjusting a bias voltage applied to at least one beam optical element configured to act on the ion beam as it is transported along the beam path if the comparing step yields an ion beam current density sample value that is inconsistent with a predicted an ion beam current density waveform.

23. An ion implantation system, comprising:
- a beamline configured to direct an ion beam along a beam path toward an end station configured to hold a workpiece;
- a scanning system responsive to a scan current waveform input, configured to scan the ion beam across a surface of the workpiece in first and second fast scan directions along a first axis to generate a scanned ion beam;
- at least one beam optical element configured to bend, deflect, focus, or otherwise modify the ion beam as the ion beam is directed toward the end station; and
- a beam sampling system configured to sample a beam current density of the ion beam as it is scanned in the first and second fast scan directions, the beam sampling system comprising:
  - a plurality of side Faraday cups positioned about a periphery of the workpiece;
  - a tuning Faraday cup positioned downstream of the workpiece along the beam path; and
  - a controller configured to:
    - analyze an output of the beam sampling system and correlate the output with the scanning system to provide a beam current density value relative to a position and scan direction of the ion beam with respect to the workpiece;
    - calculate a predicted dose uniformity of the ion beam; and
    - provide a control signal if a sampled ion beam value is inconsistent with the predicted dose uniformity.

* * * * *